United States Patent [19]

Ichimaru

[11] Patent Number: 6,084,435
[45] Date of Patent: Jul. 4, 2000

[54] LOGIC CIRCUIT

[75] Inventor: Kouzou Ichimaru, Kunisaki Higash, Japan

[73] Assignee: Texas Instruments Incorporated, Dallas, Tex.

[21] Appl. No.: 09/004,240

[22] Filed: Jan. 8, 1998

[30] Foreign Application Priority Data

Jan. 8, 1997 [JP] Japan .................................. 9-001263

[51] Int. Cl.[7] ..................... H03K 19/082; H03K 19/094; H03K 19/20
[52] U.S. Cl. .......................... 326/110; 326/109; 326/115; 326/126
[58] Field of Search .............................. 326/84, 126, 127, 326/109, 110, 31, 32, 33, 34; 327/530, 531, 541, 543; 323/313

[56] References Cited

U.S. PATENT DOCUMENTS

| | | | |
|---|---|---|---|
| 4,713,560 | 12/1987 | Herndon | 326/110 |
| 5,162,668 | 11/1992 | Chen et al. | 326/88 |
| 5,283,479 | 2/1994 | Rosseel et al. | 326/84 |

*Primary Examiner*—Michael Tokar
*Assistant Examiner*—A. Tran
*Attorney, Agent, or Firm*—William B. Kempler; Frederick J. Telecky, Jr.

[57] ABSTRACT

A logic circuit contains a first transistor with a logic signal supplied to the base and having its collector connected to an output node. A second transistor has a collector connected to the emitter of the first transistor and an emitter connected to a reference potential, in which the collector current supplied to the first transistor corresponds to the level of the control signal supplied to the base. A p-channel insulated gate field-effect transistor is connected between the power supply and the output node, and a first bias circuit supplies a bias voltage to the gate of the p-channel insulated gate field-effect transistor as the load. An n-channel insulated gate field-effect transistor is connected between the power supply and the output node and parallel to the p-channel insulated gate field-effect transistor as the load, and a second bias circuit supplies a bias voltage to the gate of the n-channel insulated gate field-effect transistor.

3 Claims, 3 Drawing Sheets

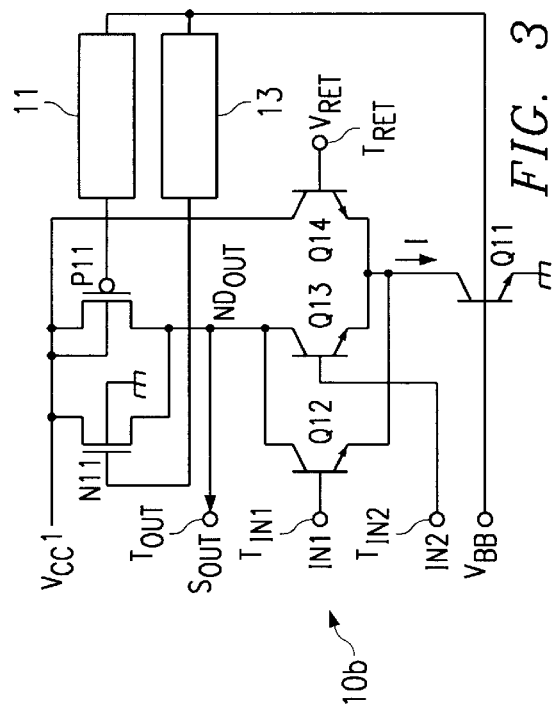
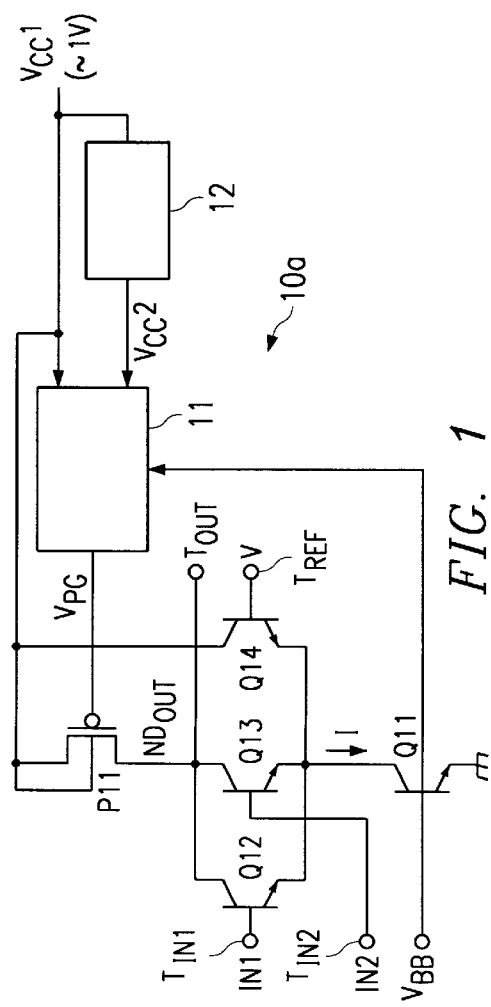
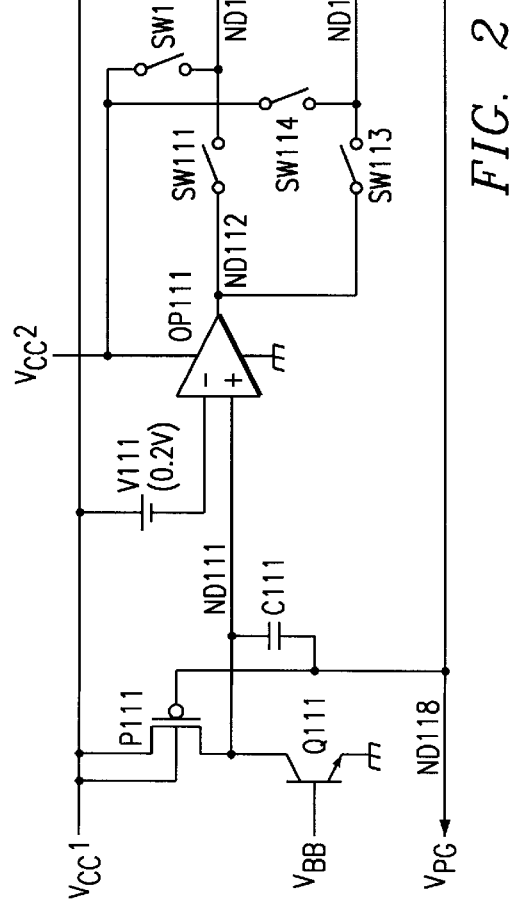

LOGIC CIRCUIT

BACKGROUND OF THE INVENTION

1. Technical Field of the Invention

The present invention pertains to NOR circuit or other logic circuit operating in the current mode.

2. Related Art

FIG. 8 is a circuit diagram illustrating an example of the configuration of a conventional current-mode logic circuit. Logic circuit (10) shown in the figure is a NOR logic element composed of npn transistors Q11–Q14 and resistance element R11.

The base of transistor Q11 is connected to the feed line of control signal VBB, the emitter is grounded, and the collector is connected to the emitters of transistors Q12–Q14. The base of transistor Q12 is connected to input terminal TIN1 of first input signal IN1, the base of transistor Q13 is connected to input terminal TIN2 of the second input signal IN2, and the base of transistor Q14 is connected to input terminal TREF of reference signal VREF of transistor Q14.

The collectors of transistors Q12 and Q13 are connected through resistance element R11 to the supply line of power supply voltage Vcc, and the collector of transistor Q14 is connected to the supply line of power supply voltage Vcc.

Output node NDOUT forms the connecting point between the collectors of transistors Q12 and Q13 and resistance element R11, and its output node NDOUT is connected to output terminal TOUT.

In the aforementioned configuration, when either the first or second input signal IN1 or IN2 is high, transistor Q12 or transistor Q13 turns on, the potential of output node NDOUT is pulled to ground, and the output signal level SOUT goes low.

In this case, control signal VBB is fed from another circuit to the base of transistor Q11, and constant current I flows into the collector of transistor Q11. If the resistance of resistance element R11 is R, the logic amplitude VL of the low-level output is given by the following formula.

$$V_L = R \times I \quad \text{Numerical formula 1}$$

Usually, when this value is 0.2–0.3 V, the circuit can be used as a logic circuit.

However, in order to realize low power consumption for this circuit, the resistance R of resistance element R11 must be very large.

For example, if VL=0.2 V when I=1 microampere, R=200 kiloohms. It is undesirable to use many such high resistance elements in the conventional IC process from the standpoint of cost and parasitic elements.

An object of the present invention is to solve the aforementioned problems of the conventional technology by providing a type of logic circuit in which the power consumption can be reduced without increasing the size.

SUMMARY OF THE INVENTION

In order to realize the aforementioned purpose, the present invention provides a logic circuit which contains a first transistor with the logic signal supplied to the base and with the collector connected to an output node; a second transistor with the collector connected to the emitter of the aforementioned first transistor and the emitter connected to a reference potential, wherein the collector current is supplied to the aforementioned first transistor corresponding the level of the control signal supplied to the base; a p-channel insulated gate field-effect transistor connected between the power supply and the aforementioned output node; and a first bias circuit for supplying a bias voltage to the gate of the aforementioned p-channel insulated gate field-effect transistor as load.

One aspect of the logic circuit of the present invention, there is an n-channel insulated gate field-effect transistor connected between the aforementioned power supply and the aforementioned output node and parallel to the p-channel insulated gate field-effect transistor as the load, and a second bias circuit for supplying a bias voltage to the gate of the aforementioned n-channel insulated gate field-effect transistor.

Also, in another aspect of the logic circuit of the present invention, the aforementioned first bias circuit contains a third transistor which has the aforementioned control signal supplied to the base and the emitter connected to a reference potential; a second p-channel insulated gate field-effect transistor connected between the collector of the aforementioned third transistor and the aforementioned power supply; and a feedback circuit which detects the collector voltage when the control signal is supplied to the aforementioned third transistor, and, based on the detected voltage and the reference voltage, holds the gate potential of the aforementioned second p-channel insulated gate field-effect transistor at a prescribed potential at which the current flowing in the aforementioned second p-channel insulated gate field-effect transistor is greater than the collector current of the aforementioned third transistor; and the gate of the aforementioned p-channel insulated gate field-effect transistor as the load is biased by the aforementioned holding potential.

Also, in a further aspect of the logic circuit of the present invention, the aforementioned second bias circuit has a fourth transistor which has the aforementioned control signal supplied to the base and the emitter connected to a reference potential; a third p-channel insulated gate field-effect transistor connected between the collector of the aforementioned fourth transistor and the aforementioned power supply and with the gate biased to a prescribed potential; and a second feedback circuit which is connected between the collector of the aforementioned fourth transistor and the aforementioned power supply, and which detects the collector voltage when the control signal is supplied to the aforementioned fourth transistor, and, based on the detected voltage and the reference voltage, holds the gate potential of the aforementioned third p-channel insulated gate field-effect transistor at a prescribed potential at which the current flowing in the aforementioned third p-channel insulated gate field-effect transistor is greater than the collector current of the aforementioned fourth transistor; and the gate of the aforementioned n-channel insulated gate field-effect transistor is biased by the holding potential of the aforementioned second feedback circuit.

Since the logic circuit of the present invention makes use of a p-channel insulated gate field-effect transistor to form the load element instead of using a resistive element, it can realize a high-speed logic circuit that can operate with a low-voltage power supply and a low-speed logic circuit with low power consumption. Also, the circuit is compact, and it is possible to prevent the overall circuit size from becoming larger.

DETAILED DESCRIPTION

Embodiment 1

FIG. 1 is a circuit diagram illustrating Embodiment 1 of the current-mode logic circuit of the present invention. The same element numbers as those used in FIG. 8 of the conventional example are adopted in this case.

Logic circuit (10a) in Embodiment 1 of the present invention is a NOR logic circuit composed of npn transistors Q11–Q14, p-channel MOS (referred to as PMOS hereinafter) transistor P11, bias circuit (11), and DC-DC converter (12).

The source of PMOS transistor P11 and the base (back gate) are connected to the supple line of power supply voltage Vcc, and the drain is connected to the collectors of npn transistors Q12 and Q13. These connection points form output node $ND_{OUT}$. The gate of PMOS transistor P11 is connected to the output line of bias voltage VPG of bias circuit (11).

For example, bias circuit (11) has a charge pump type circuit. It receives first power supply voltage Vcc1 and second power supply voltage Vcc2 generated by DC-DC converter (12), generates bias voltage VPG, and feeds it to the gate of PMOS transistor P11.

DC-DC converter (12) converts first power supply voltage Vcc1 of about 1 V to second power supply voltage Vcc2 of about 2 V, and feeds it to bias circuit (11).

In logic circuit (10a) of said Embodiment 1 of the present invention, resistive element R11 in said FIG. 8 is replaced by PMOS transistor P11, and the gate is biased by circuit (11) with a charge pump. In this way, PMOS transistor P11 acts as a substitute of the aforementioned resistive element.

As far as the size of PMOS transistor P11 is concerned, the channel length L is about 0.8 micrometer, and channel width W is about 2 micrometer. By controlling the gate voltage, a resistance of about 200 kiloohms can be realized.

Compared with the conventional case when a resistive element is used as the load element, the area of the circuit element can be reduced by a factor of 100.

In this circuit, first power supply voltage Vcc1 may be about 1 V.

Bias circuit (11) using a charge pump requires another power supply voltage Vcc2. In practice, Vcc2 should be about 2 V or more. However, since the current consumed in this case is small, it can be formed by first power supply voltage Vcc1 simply by means of DC-DC converter (12).

Consequently, this logic circuit can operate under Vcc1 (about 1 V) alone. That is, it is for a system using merely one dry cell battery. Also, it is possible to change the operating speed of the logic circuit by adjusting the current flowing in transistor Q11.

In the following, a specific example of bias circuit (11) will be explained with reference to FIG. 2.

FIG. 2 is a circuit diagram illustrating an example of configuration of bias circuit (11) of PMOS transistor P11.

As shown in FIG. 2, said bias circuit (11) comprises PMOS transistors P111–P113, npn transistor Q111, operational amplifier OP111, capacitors C111–C114, 0.2-V constant-voltage power supply V111, analog switches SW111–SW114, diodes D111 and D112, and resistive elements R111 and R112.

The source of PMOS transistor P111 and the substrate (back gate) are connected to the feed line of first power supply voltage Vcc1. The drain is connected to the collector of npn transistor Q111, the other electrode of capacitor C111 and the noninverting input (+) of operational amplifier OP111. These connection points form node ND111. The gate of PMOS transistor P111 is connected to the other electrode of capacitor C111 and one end of resistive element R112. These connection points form node ND118.

The base of npn transistor Q111 is connected to the feed line of control signal VBB, and the emitter is grounded.

The inverting input (–) of operational amplifier OP111 is connected to the negative electrode of constant-voltage source V111, and its output is connected to one end of each of analog switches SW111 and SW113. Also, second power supply voltage Vcc2 is fed by DC-DC converter to operational amplifier OP111. The positive electrode of constant-voltage source V111 is connected to the feed line of first power supply voltage Vcc1.

The other terminal of analog switch SW111 is connected to one terminal of analog switch SW112 and one electrode of capacitor C112, and the other terminal of analog switch SW113 is connected to one terminal of analog switch SW114 and one electrode of capacitor C113. The other terminal of analog switch SW112 and the other terminal of analog switch SW114 are connected to the feed line of second power supply voltage Vcc2.

The other electrode of capacitor C112 is connected to the anode of diode D111 and the drain and gate of PMOS transistor P112. The other electrode of capacitor C113 is connected to the anode of diode D112 and the drain and gate of PMOS transistor P113.

The cathodes of diodes D111 and D112 are interconnected, and their connection point and the substrate (back gate) of PMOS transistors P112 and P113 are connected to the supply line of first power supply voltage Vcc1. The sources of PMOS transistors P112 and P113 are connected to one end of resistive element Rill, the other end of resistive element R112, and one electrode of smoothing capacitor C114. These connection points form node ND117.

The other end of resistor terminal R11 and the other electrode of capacitor C114 are connected to the supply line of first power supply voltage Vcc1.

In bias circuit (11) with the aforementioned configuration, for example, analog switches SW112 and SW114 are analog switches made of PMOS transistors, and analog switches SW111 and SW113 are analog switches with the sources/drains of PMOS transistors and NMOS transistors interconnected.

Control is performed repeatedly in an alternating manner, that is, when analog switches SW111 and SW114 are on, analog switches SW112 and SW113 are off. On the other hand, if analog switches SW111 and SW114 are OFF, analog switches SW112 and SW113 are ON.

In this configuration, at first, when the potential of $V_{PG}$ is near Vcc1, PMOS transistor P111 is near the OFF state.

When logic circuit (10a) is in operation, control signal VBH is fed from another circuit to the base of transistor Q11, and, at the same time, it is also fed to the base of transistor Q111 of bias circuit (11).

As a result, the potential of node ND111 is pulled down to near ground potential GND by the collector current of transistor Q111. Consequently, the noninverting input (+) side of operational amplifier OP111 becomes lower than the inverting input (–) side fixed at (Vcc1–0.2 V). Hence, the potential of node ND112 decreases to near GND.

Since analog switches SW111, SW114 and analog switches SW112 and SW113 are alternately controlled to turn on and off, pulses (Vcc2-(potential at node ND112)) are generated at nodes ND113, ND114.

As a result, the pulses are transferred through capacitors C112 and C113 to nodes ND115 and ND116.

In this case, when the potential is high at nodes ND115 and ND116, current flows from capacitors C112 and C113 to diodes D111 and D112.

On the other hand, when the potential is low at nodes ND115 and ND116, current flows through PMOS transistors P112 and P113 to capacitors C111 and C112, and this current pulls down the potential at node ND117.

Since node ND117 is connected through resistive element R111 to the supply line of first power supply voltage Vcc1, current flows through resistive element R111 from first power supply voltage Vcc1 to node ND117.

However, since the total current IM of the currents flowing through said PMOS transistors P112 and P113 is greater than the current flowing through resistance element R111, the potential at node ND117 continues to fall.

Since node ND117 and node ND118 (potential $V_{PG}$) are connected through resistive element R112, the potential at node ND111 falls a little slower due to capacitor C111.

Since the voltage of the gate of PMOS transistor P111 falls, the gate voltage of PMOS transistor P111 goes higher than VT, and current begins to flow. As the gate voltage falls further, the drain current of PMOS transistor P111 becomes greater than the collector current of transistor Q111. Consequently, the potential at node ND111 rises.

Since the potential at node ND111 approaches Vcc1–0.2 V, the output potential of operational amplifier OP111 rises to the output potential of operational amplifier OP111 (the potential at node ND112). Consequently, current IM decreases, and the overall circuit becomes stable when the potential at node ND111 reaches Vcc1–0.2 V.

Potential VPG at node ND118 is sent to the gate of PMOS transistor P11 in logic circuit (10a).

In this bias state, when either first input signal IN1 or second input signal IN2 is high, transistor Q12 or Q13 on, the potential of output node NDOUT is pulled down to ground potential and the level of output signal SOUT goes low.

As explained above, in the embodiment of the present invention, PMOS transistor P11 is used in place of the resistive element as the load element, and a bias is applied to the gate by circuit (11) with a charge pump. Consequently, PMOS transistor P11 can function as a replacement for the resistive element, so that a reduced power consumption can be realized without an increase in size, and it is possible to realize a high-speed logic circuit with a low-voltage power supply (a single cell battery) and a low-speed logic circuit with reduced power consumption.

Also, as far as the circuit size is concerned, the circuit can be made compact, and it is possible to prevent the overall circuit size from becoming larger.

In addition, since the logic circuit is a constant-current logic circuit, there is no power supply noise, as would be the case with a CMOS logic circuit. Consequently, it is possible to realize a logic circuit with high precision.

Due to these advantages, the logic circuit can significantly expand the field of application of digital/analog hybrid ICs. This is an advantage.

Embodiment 2

FIG. 3 is a circuit diagram illustrating Embodiment 2 of the current-mode logic circuit of the present invention.

Embodiment 2 differs from said Embodiment 1 in that between the supply line of first power supply voltage Vcc1 and output node $ND_{out}$, n-channel MOS (NMOS) transistor N11 is arranged in parallel to PMOS transistor P11 as load, and bias circuit (13) of NMOS transistor N11 with the charge pump circuit, like bias circuit (11), is used.

Because PMOS transistor P11 nearly performs constant-current operation when the current flowing through PMOS transistor P11 is low, said NMOS transistor N11 is arranged to perform complementary operation to supply supplementary current in order to maintain a stable output potential near the saturation region of PMOS transistor P11.

The DC-DC converter is omitted from FIG. 3.

As shown in FIG. 4, bias circuit (13) includes npn transistor Q131, PMOS transistor P131, NMOS transistor N131, operational amplifier OP131, capacitors C131–C134, 0.2-V constant-voltage source V131, analog switches SW131–SW134, diodes D131–D134, and resistive elements R131 and R132.

The source of PMOS transistor P131 and the substrate (back gate) are connected to the supply line of first power supply voltage Vcc1. The drain is connected to the collector of npn transistor Q131, the source of NMOS transistor N131 and the noninverting input (+) of operational amplifier OP131. These connection points form node ND131. Bias voltage VPG of bias circuit (11) is supplied to the gate of PMOS transistor P131.

The drain of NMOS transistor N131 is connected to the supply line of first power supply voltage Vcc1, and its gate is connected to one end of resistive element R132 and one electrode of capacitor C131. The other electrode of capacitor C131 is grounded. The base of npn transistor Q131 is connected to the feed line of control signal VBB.

The inverting input (–) of operational amplifier OP131 is connected to the negative electrode of 0.2-V constant-voltage source V131, and its output is connected to one end of each of analog switches SW131 and SW133. Also, second power supply voltage Vcc2 is supplied by DC-DC converter to operational amplifier OP131. The positive electrode of constant-voltage source V131 is connected to the supply line of first power supply voltage Vcc1.

The other terminal of analog switch SWl31 is connected to one terminal of analog switch SW132 and one electrode of capacitor C132, and the other terminal of analog switch SW133 is connected to one terminal of analog switch SW134 and one electrode of capacitor C133. The other terminal of analog switch SW132 and the other terminal of analog switch SW134 are connected to the supply line of second power supply voltage Vcc2.

The other electrode of capacitor C132 is connected to the cathode of diode D131 and the anode of diode D133. The other electrode of capacitor C133 is connected to the cathode of diode D132 and the anode of diode D134.

The anodes of diodes D131 and D132 are interconnected, and their connection point is connected to the supply line of first power supply voltage Vcc1 and one end of resistor terminal R131. The cathodes of diodes D133 and D134 are connected to the other ends of resistive elements R131 and R132, and one electrode of capacitor C134. The other electrode of capacitor C134 is grounded.

In bias circuit (13) with the aforementioned configuration, for example, analog switches SW132 and SW134 are analog switches made of PMOS transistors, and analog switches SW131 and SW133 are analog switches with the sources/drains of PMOS transistors and NMOS transistors interconnected.

The analog switches are continuously controlled in alternating fashion, that is, when analog switches SW131 and SW134 are closed, analog switches SW132 and SW133 are open. On the other hand, when analog switches SW131 and SW134 are open, analog switches SW132 and SW133 are closed.

Since the operation of bias circuit (13) is basically identical to that of bias circuit (11), it will not be explained in detail.

In this circuit, the gate width of PMOS transistor P111 in bias circuit (11) is made much smaller. Also, the size of PMOS transistor P131 is selected to be equal to that of PMOS transistor P11 in logic circuit (10b).

In this configuration, if there were no NMOS transistor N131, the potential at node ND131 would be lower than Vcc1–0.2 V. However, since NMOS transistor N131 is actually contained in the feedback loop, the gate potential of NMOS transistor N131 is determined such that the potential at node ND131 becomes Vcc1−0.2 V.

When the size of PMOS transistor P111 in bias circuit (11) is selected appropriately, it is possible to adjust the rise/fall time of the output of logic circuit (10b).

In Embodiment 2 of the present invention, in addition to the effects of said Embodiment 1, it is also possible to realize a logic circuit with even higher precision.

Also, since the bias circuit is shared by the entire circuit, the overall circuit scale does not become larger. However, when logic circuits having several different operating rates are used, the corresponding number of bias circuits must be used.

Embodiment 3

FIG. 5 is a circuit diagram illustrating Embodiment 3 of the current-mode logic circuit of the present invention.

The circuit shown in FIG. 5 illustrates an example of application in a low-voltage operating flip-flop circuit.

As shown in FIG. 5, logic circuit (10c) comprises PMOS transistors P11a–P11d for use as the load and are biased by voltage $V_{pg}$ from bias circuit (11), npn transistors Q11a and Q11b for use as a current source, npn transistors, Q12a, Q13a, Q12b, Q13b, Q12c, Q13c, Q12d, and Q13d, which have their emitter connected to each other to form a differential pair for signal input, and npn transistors Q15a–Q15d for current switching.

In this circuit, the sources of PMOS transistors P11a–P11d are connected to the supply line of first power supply voltage Vcc1, and the gates are connected to the output of bias circuit (11).

The drain of PMOS transistor P11a is connected to the collectors of transistors Q12a and Q12b and the bases of transistors Q13b and Q12c. The drain of PMOS transistor P11b is connected to the collectors of transistors Q13a and Q13b and the bases of transistors Q12b and Q13c.

The drain of PMOS transistor P11c is connected to the collectors of transistors Q12c and Q12d, and these connection points form output Q of the flip-flop circuit.

The drain of PMOS transistor P11d is connected to the collectors of transistors Q13c and Q13d and the bases of transistors Q12d and Q13d. These connection points form the inverted output QB of the flip-flop circuit.

Also, data D is fed to the base of transistor Q12a, and inverted data DB is fed to the base of transistor (13a).

The connection point between emitters of transistors Q12a and Q13a is connected to the collector of transistor Q15a; the connection point between the emitters of transistors Q12b and Q13b is connected to the collector of transistor Q15b; the connection point between emitters of transistors Q12c and Q13c is connected to the collector of transistor Q15c; and the connection point between emitters of transistors Q12d and Q13d is connected to the collector of transistor Q15d.

Emitters of transistors Q15a and Q15b are connected to each other, and the connection point is connected to the collector of transistor Q11a. Similarly, emitters of transistors Q15c and Q15d are interconnected, and the connection point is connected to the collector of transistor Q11b.

Clock signal CK is fed to the bases of transistors Q15b and Q15c, and the inverted clock signal CKB is fed to the bases of transistors Q15a and Q15b.

Also, control signal VBB is fed to the bases of transistors Q11a and Q11b.

When flip-flop circuit (10c) with the aforementioned configuration is toggled in the practical operation, as shown in FIG. 6, it operates at a frequency of 625 MHz under condition of Vcc1=1.1 V and Icc1=60 microampere.

Also, as in Embodiment 2, NMOS transistors are arranged in parallel to PMOS transistors P11a–P11d, and, when Icc1=1 microampere, the operation is performed at a frequency of 10 MHz as shown in FIG. 7.

In this way, the present invention can realize a high-speed logic circuit with a low-voltage power supply, and a low-speed logic circuit with low power consumption. This is an advantage.

As explained above, the present invention can reduce the power consumption without an increase in size, and it can realize a high-speed logic circuit with a low-voltage power supply, and a low-speed logic circuit with low power consumption.

Also, the circuit is compact, and it is possible to prevent the overall circuit from becoming larger.

In addition, since the logic circuit is a constant-current logic circuit, there is no power supply noise, as would take place with a CMOS logic circuit. Consequently, it is possible to realize a logic circuit with high precision.

BRIEF EXPLANATION OF FIGURES

FIG. 1 It is a circuit diagram illustrating Embodiment 1 of the current-mode logic circuit of the present invention.

FIG. 2 It is a circuit diagram illustrating an example of the configuration of the bias circuit for the PMOS transistor in the present invention.

FIG. 3 It is a circuit diagram illustrating Embodiment 2 of the current-mode logic circuit of the present invention.

EXPLANATION OF PART NUMBERS

Figure 4:
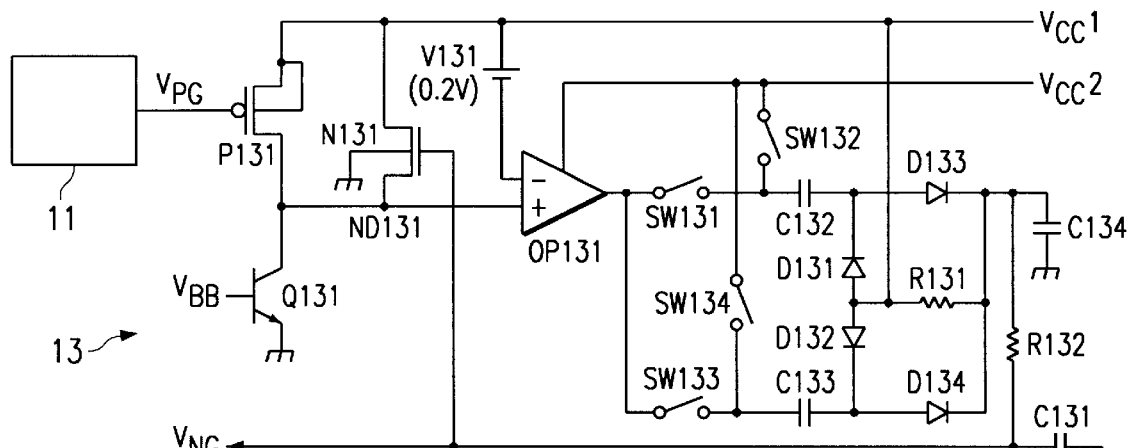
FIG. 4 It is a circuit diagram illustrating an example of the configuration of the bias circuit for the NMOS transistor in the present invention.
Figure 5:
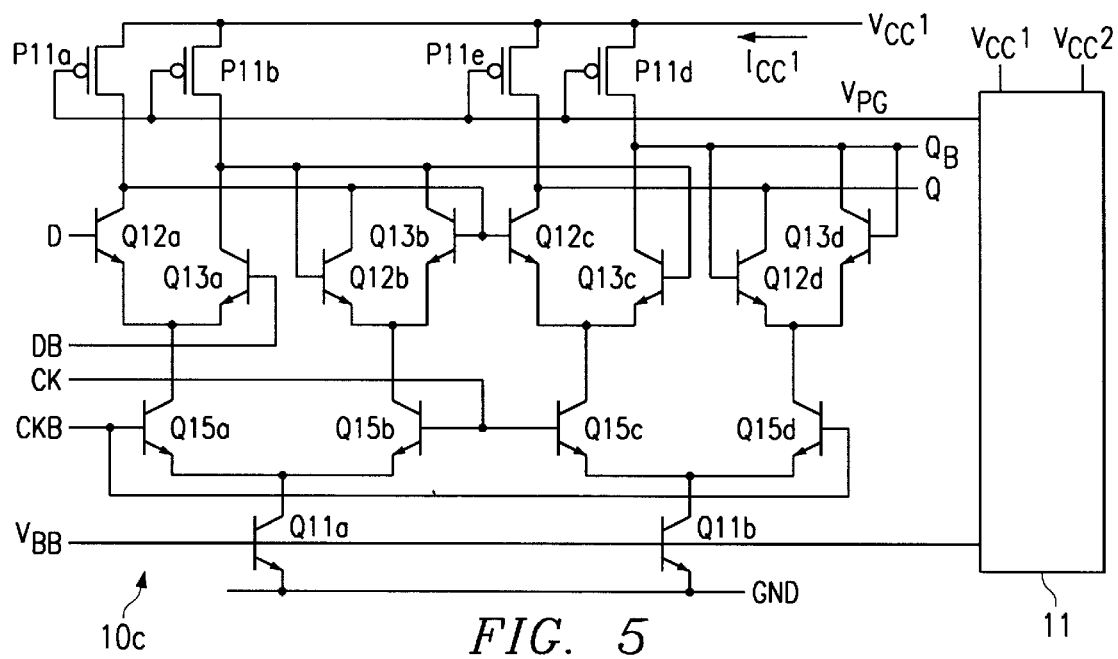
FIG. 5 It is a circuit diagram illustrating Embodiment 3 of the current-mode logic circuit in the present invention.
Figure 8:
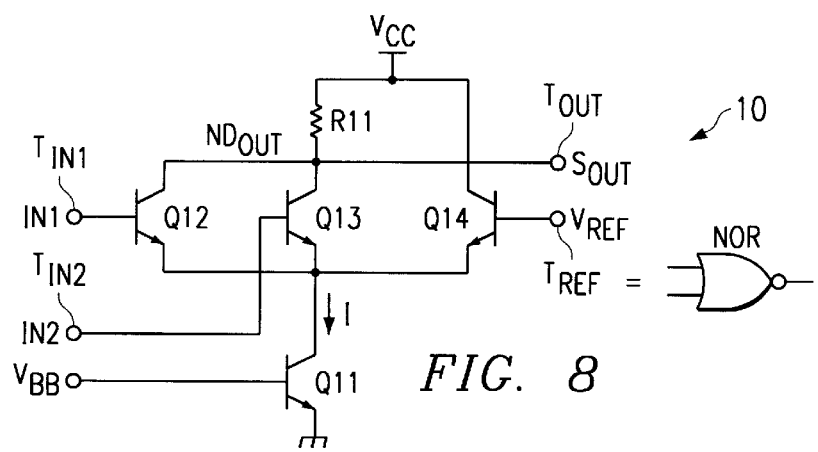
FIG. 8 It is a circuit diagram illustrating an example of the configuration of the conventional current-mode logic circuit.
Figure 6:
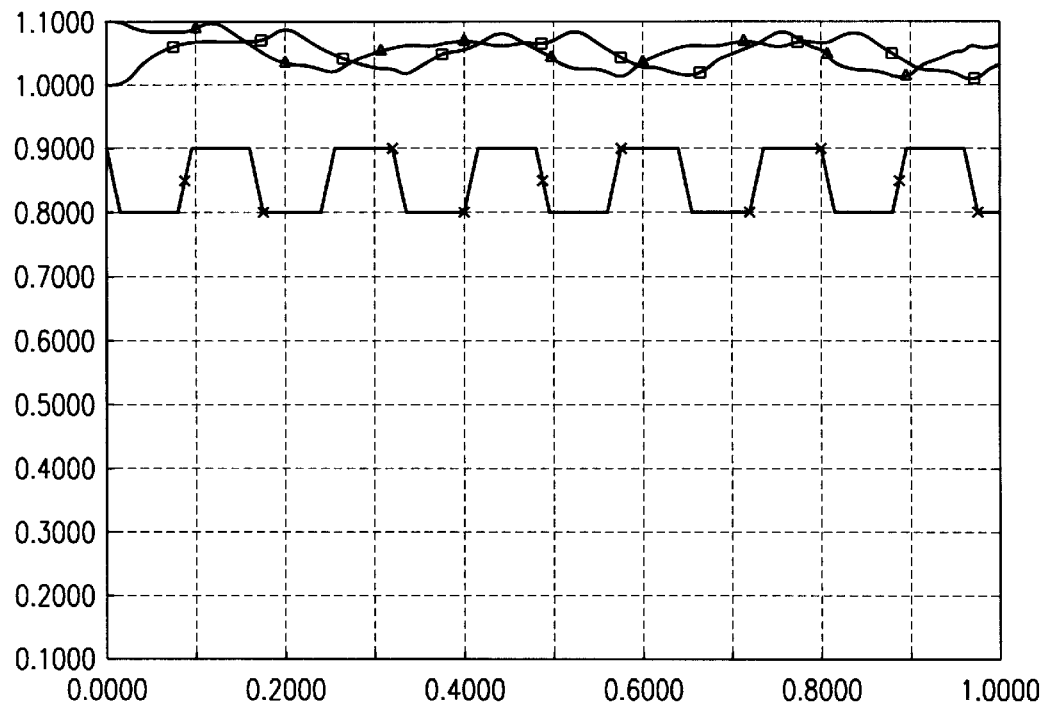
FIG. 6 It is a diagram illustrating the results of simulation of the circuit shown in FIG. 5.
Figure 7:
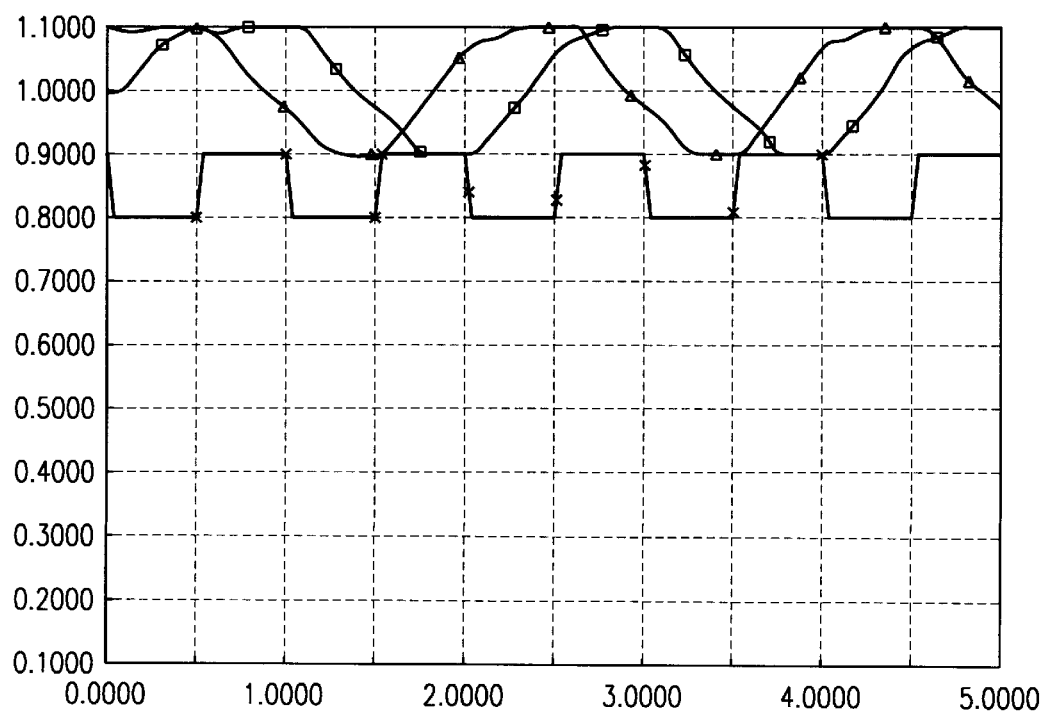
FIG. 7 It is a diagram illustrating the results of simulation of the circuit with NMOS transistors added in parallel to the PMOS transistors.

10a–10c Logic circuit
11 Bias circuit for PMOS transistors,
p111–p113 PMOS transistor
Q111 an npn transistor
OP111 Operational amplifier
C111–C114 Capacitors
V111 0.2-V constant-voltage power supply
SW111–SW114 Analog switches,
D111, D112 Diodes
R111, R112 Resistive element
12 Dc-Dc converter
13 Bias circuit for NMOS transistors
P131 PMOS transistor
N131 an NMOS transistor
OP131 Operational amplifier
C131–C134 Capacitor
V131 0.2-V constant-voltage power supply
SW131–SW134 analog switches
D131–D134 Diodes
R131, R132 Resistive elements
P11, P11a–P11d PMOS transistors for use as load
Q11, Q11a, Q11b npn transistor for use as current source
Q12, Q12a–Q12d, Q13a–Q13d npn transistor for signal input
Q14a–Q15d npn transistor for current switching

What is claimed is:

1. A logic circuit comprising:

a first transistor having a logic signal supplied to a base and a collector connected to an output node;

a second transistor having a collector connected to an emitter of the first transistor and an emitter connected to a reference potential, wherein a collector current is supplied to the first transistor corresponding to the level of the control signal supplied to the base;

a p-channel insulated gate field-effect transistor connected between a power supply and an output node;

first bias circuit for supplying a bias voltage to a gate of the p-channel insulated gate field-effect transistor as the load; and an n-channel insulated gate field-effect transistor connected between the power supply and the output node and parallel to the p-channel insulated gate field-effect transistor as the load, and a second bias circuit for supplying a bias voltage to the gate of the n-channel insulated gate field-effect transistor.

2. The logic circuit described in claim 1 wherein the first bias circuit contains a third transistor which has the control signal supplied to the base and the emitter connected to a reference potential;

a second p-channel insulated gate field-effect transistor connected between the collector of the third transistor and the power supply;

and a feedback circuit which detects the collector voltage when the control signal is supplied to the third transistor, and, based on the detected voltage and the reference voltage, holds the gate potential of the second p-channel insulated gate field-effect transistor at a prescribed potential at which the current flowing in the second p-channel insulated gate field-effect transistor is greater than the collector current of the third transistor;

and the gate of the p-channel insulated gate field-effect transistor as the load is biased by the holding potential.

3. The logic circuit described in claim 1 or 2 wherein the second bias circuit has a fourth transistor which has the control signal supplied to the base and the emitter connected to a reference potential;

a third p-channel insulated gate field-effect transistor connected between the collector of the fourth transistor and the power supply and with the gate biased to a prescribed potential;

and a second feedback circuit which is connected between the collector of the fourth transistor and the power supply, and which detects the collector voltage when the control signal is supplied to the fourth transistor, and, based on the detected voltage and the reference voltage, holds the gate potential of the third p-channel insulated gate field-effect transistor at a prescribed potential at which the current flowing in the third p-channel insulated gate field-effect transistor is greater than the collector current of the fourth transistor;

and the gate of the n-channel insulated gate field-effect transistor is biased by the holding potential of the second feedback circuit.

* * * * *